US011450473B2

United States Patent
Macías Torres

(10) Patent No.: US 11,450,473 B2
(45) Date of Patent: Sep. 20, 2022

(54) ARRANGEMENT OF INTERLEAVED WINDINGS FOR POWER TRANSFORMERS

(71) Applicant: PROLEC GE INTERNACIONAL, S.DE R.L. DE C.V., Nuevo León (MX)

(72) Inventor: Julio César Macías Torres, Col. Jardines de Andalucía (MX)

(73) Assignee: PROLEC GE INTERNACIONAL, S. DE. R. L. DE C.V.

( * ) Notice: Subject to any disclaimer, the term of this patent is extended or adjusted under 35 U.S.C. 154(b) by 302 days.

(21) Appl. No.: 16/498,575

(22) PCT Filed: Apr. 2, 2018

(86) PCT No.: PCT/MX2018/050008
§ 371 (c)(1),
(2) Date: Sep. 27, 2019

(87) PCT Pub. No.: WO2018/186730
PCT Pub. Date: Oct. 11, 2018

(65) Prior Publication Data
US 2021/0110961 A1 Apr. 15, 2021

(30) Foreign Application Priority Data
Apr. 3, 2017 (MX) .................. MX/a/2017/004361

(51) Int. Cl.
*H01F 27/28* (2006.01)
*G01R 31/62* (2020.01)
(52) U.S. Cl.
CPC ......... *H01F 27/2804* (2013.01); *G01R 31/62* (2020.01); *H01F 2027/2809* (2013.01)
(58) Field of Classification Search
CPC ......... H01F 27/2804; H01F 2027/2809; H01F 27/2866; H01F 27/2871; H01F 2027/2838; H01F 27/343

USPC .......... 336/70, 180–183, 185–189, 192, 206
See application file for complete search history.

(56) References Cited

U.S. PATENT DOCUMENTS

| 3,210,703 A | 10/1965 | Lockie | |
| 3,467,931 A | * 9/1969 | Dutton | H01F 27/2871 336/180 |
| 3,611,228 A | * 10/1971 | Walling | H01F 29/02 336/70 |
| 4,300,112 A | * 11/1981 | Leibinger | H01F 27/2823 336/180 |
| 5,473,302 A | 12/1995 | Terlop et al. | |
| 5,543,773 A | 8/1996 | Evans et al. | |
| 6,150,914 A | 11/2000 | Borho et al. | |
| 6,914,511 B2 | 7/2005 | Darmann | |

FOREIGN PATENT DOCUMENTS

| WO | 972668 | 7/1997 |
| WO | 2016005526 | 1/2016 |

OTHER PUBLICATIONS

Pedersen, A. On the response of interleaved transformer windings to surge voltages. IEEE Transactions on Power Apparatus and Systems, 1963, vol. 82, N° 66, Paginas 349-356.

* cited by examiner

Primary Examiner — Tszfung J Chan
(74) Attorney, Agent, or Firm — Emerson, Thomson & Bennett, LLC; Roger D. Emerson; Peter R. Detorre

(57) ABSTRACT

Arrangement of interleaved secondary windings for power transformers that reduces the thickness of secondary windings and allows to build transformers with an odd number of layers.

2 Claims, 4 Drawing Sheets

ARRANGEMENT OF INTERLEAVED WINDINGS FOR POWER TRANSFORMERS

FIELD OF THE INVENTION

The present invention relates to an arrangement of windings for power transformers and more particularly to a novel arrangement of interleaved secondary windings that allows reducing their number of turns, being able to use odd configurations in the number of layers of the secondary one.

BACKGROUND OF THE INVENTION

In the Electric Power Distribution Systems, one of the essential elements for the supply to residential areas is the low-capacity monophase transformer (from 5 to 167 kVA), which allows the reduction of distribution voltages (12.47, 13.2, 13.8 kV) to residential use safe voltages (120, 240 Volts). Said transformer is conventionally known as residential transformer. This type of transformer has a great commercial demand due to the small capacity and large number of transformers installed.

There are many transformers classifications; one of them based on the construction or shape of the core and it is according to the position between placement of the coils and core; two types arise from this classification:

Armored core, also called "shell" type, in which the core is covering the low and high voltage windings and;

Unarmored core, also known as column or "core" type, in which the coils surround a considerable part of the core.

Currently, the vast majority of residential transformer manufacturers use the armored core type configuration and coils wound in radial layers with aluminum sheets that form the low voltage of the transformer; however, the monophase residential appliances most commonly used to supply power from 5 kVA to 15 kVA have a rectangular copper magnet (crossbeam) as the conductor of said windings. In general, residential transformers are designed with configurations that allow modify its winding connection to supply secondary voltages of both 120 V and 240 V, and this is obtained by using two sections of secondary windings both with the same number of turns that when connected in series or parallel, achieve supply the desired voltages. These transformers, when installed outside, are exposed to a lightning surge current which penetrates the secondary windings through the terminal to the neutral (X2), which can cause transformer failures due to large induced voltages. in the primary winding.

As mentioned earlier, most 5 to 15 kVA designs have a copper crossbeam on low voltage windings, because small conducting areas are required that cannot be obtained with the range of commercially available aluminum sheets. When the copper crossbeam is used, the coil configuration is of the BT-BT-AT type; that is, the low voltage windings are the closest to the core leg and the outermost winding corresponds to the high voltage, which causes that in order to achieve the interlacing connection in the secondary windings, the partition into sections of the two low voltage windings is required and their reconnection, as shown in FIG. 1.

As it can be observed, it is necessarily required to have a minimum number of four layers (or multiple of four) in low voltage as well as a number of turns also multiple of four such that it allows a uniform distribution and in the same proportion of turns for both windings as well as to achieve complete layers at all times. The above causes a high number of turns in the low voltage windings formed with a copper conductor, which has a cost greater than double that of the Aluminum foil and 1.5 times greater than the cost of the rectangular aluminum magnet. Also, in order to maintain the desired transformation ratio, the appropriate proportion of turns in the primary winding must be provided, and since there is a high number of turns in the secondary winding, a high number of turns must also be provided in the primary winding causing the designs are not very competitive, due to the great thickness of the windings, which translates into a large final size of the transformer.

To try to overcome the dimensional inconveniences, over the years, various technical approaches have been tried, such as those described in U.S. Pat. No. 5,473,302 A, which protects a solid core transformer with a primary winding that is spiral winding, which has a secondary winding interleaved with the primary winding. In said patent, the interleaving of the secondary winding within the primary one, has the function of significantly reducing the total thickness of the windings, thereby reducing the space occupied by the transformer, while reducing resistance, leakage and parasitic inductance of the transformer. However, the patent does not consider a second section of the secondary winding, much less the mitigation of voltages induced in the primary one due to surge current in the secondary winding, so it cannot face the failures caused by lightning surge current.

U.S. Pat. No. 5,543,773 A protects a transformer with any arbitrary turn ratio that optionally has multiple secondary windings, in which the primary and secondary windings are interleaved in the same winding layer, preferably around a magnetically permeable core or an air core. Said transformer can give an optimal magnetic coupling, minimum leakage fields and insignificant proximity effect losses. However, said arrangement does not consider a second section of the secondary winding, much less the mitigation of voltages induced in the primary one due to surge current in the secondary winding, so such a scheme would not be practical for distribution transformers.

Patent application WO 2016005526 A1, describes a central tap transformer comprising at least a first winding and a second winding that are interleaved with each other, the second winding being located over the first one, in such a way that the thickness of the equipment is considerably reduced. However, although two sections are considered (layers) of primary winding and two of secondary winding, mitigation of induced voltages in the primary one due to surge current in the secondary winding is not considered.

Patent application WO 1997026668 A1 describes a coreless transformer with primary and secondary windings, in which both the first and second windings are divided into several sub-windings P1, P2, . . . , S1, S2, . . . the primary sub-windings being interleaved concentrically with the secondary sub-windings. However, although this arrangement reduces the thickness of the windings, it does not consider the mitigation of voltages induced in the primary one due to surge current in the secondary winding.

U.S. Pat. No. 3,210,703 A protects a power transformer comprising a first winding, a second winding and a third winding, concentrically wound on the core of the transformer, the second winding being interleaved with the first one in order to decrease the thickness of the layers; however, said arrangement does not consider a second section of the secondary winding, much less the mitigation of voltages induced in the primary one due to surge current in the secondary winding.

Finally, U.S. Pat. No. 6,914,511 B2, protects a superconducting transformer that includes two pairs of axially extending windings, each of said windings being formed by a plurality of turns formed by superconducting strips. In one of the embodiments of this proposal, the interleaving of the first and second secondary windings to reduce the impedance and current losses is mentioned. However, it is indicated that the interleaving of a first and a second primary windings is also necessary to achieve this purpose and does not consider a second section of the secondary winding, much less the mitigation of voltages induced in the primary one due to surge current in the secondary winding.

None of the arrangements described above can mitigate the voltages induced in the primary winding, so they cannot face the lightning surge current, limiting its use to unexposed environments. Likewise, due to its construction, the above mentioned arrangements would not be practical to be implemented in residential distribution transformers.

In view of the above problem, there is a need to provide a new winding arrangement that allows reducing the number of layers, interleaving only the secondary ones of the same and, at the same time, can face the lightning surge current, mitigating the voltages induced in primary windings due to surge currents in the secondary windings.

SUMMARY OF THE INVENTION

The present invention aims to provide a novel arrangement of interleaved secondary windings, which produce local and immediately opposite magnetic fields that even more effectively cancel the voltage induced in the primary winding, without increasing the risk of failure because of surge current.

A further object of the present invention is to provide an arrangement of interleaved secondary windings, which makes the equivalent voltages induced in each of them equal and opposite, so that when forming the loop when connected in parallel, the resulting equivalent voltage is very close to zero and the circulating current generated has a negligible magnitude.

It is also an object of the invention to provide an arrangement of interleaved secondary windings that allows manufacturing transformers with an odd number of turns in the secondary windings.

A further object of the present invention is to provide an arrangement of interleaved secondary windings, which allows the radial dimensions of the coil to be reduced.

Another object of the present invention is to provide an arrangement of interleaved secondary windings that support transient electrical stresses caused by atmospheric discharge (lightning impulse) and permanent electrical stresses due to operating voltages (induced voltage).

A further object of the present invention is to provide an arrangement of interleaved secondary windings that allows to preserve in reliable values the performance parameters such as polarity, transformation ratio, ohmic resistance of the windings and power losses in vacuum operation.

The above mentioned objects, as well as others and the advantages of the present invention, will become apparent from the following detailed description thereof.

DESCRIPTION OF THE FIGURES OF THE INVENTION

DETAILED DESCRIPTION OF THE INVENTION

Figure 1:
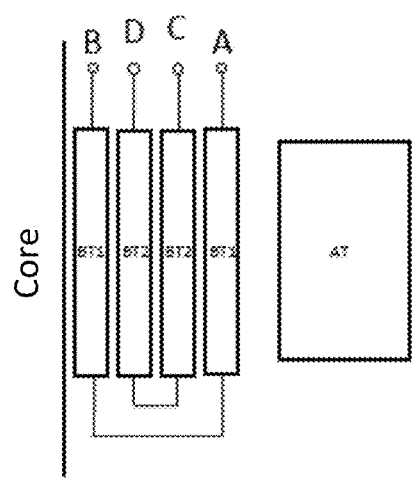
FIG. 1 shows the configuration of the secondary windings (BT1 and BT2) for interlacing connection.
Figure 2:
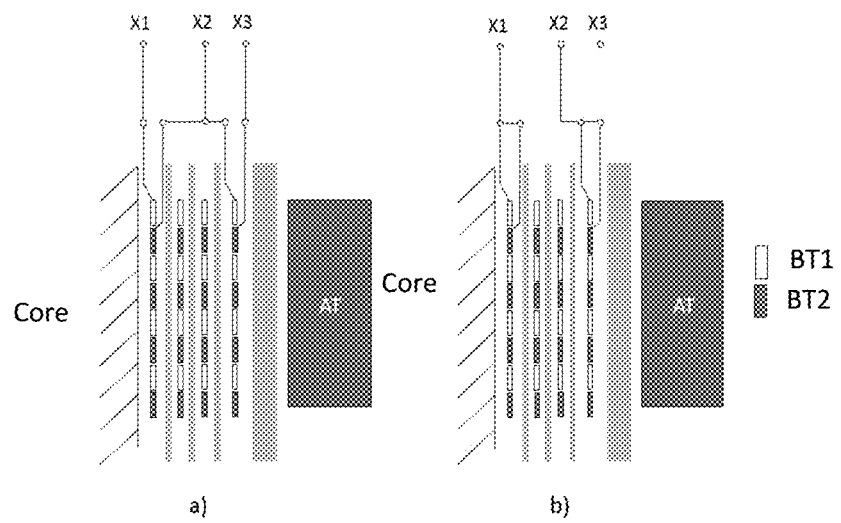
FIG. 2 shows the interleaved connection of the secondary windings of the present invention where: a) serial connection, b) parallel connection.

The present invention provides a novel arrangement of secondary windings, based on simultaneously winding the conductors of the two sections of low voltage winding (BT1 and BT2). To do this, two conductors are wound adjacently until the total of the turns is achieved along all the required layers, ensuring that they always remain isolated from each other and that at the ends they are connected in such a way that they constitute the two necessary windings in the secondary. FIG. 2 shows the arrangement of the windings of the present invention and how they are connected to the secondary terminals (X1, X2 and X3).

Said interlaced arrangement allows current flows that are contrasted with each other in the sections of the low voltage winding, which in turn forces the magnetic fields generated around the conductors, also have opposite turns and there is a decrease in their effect by inducing a voltage in the high-voltage winding of lesser magnitude than in an apparatus without interlacing.

Figure 3:
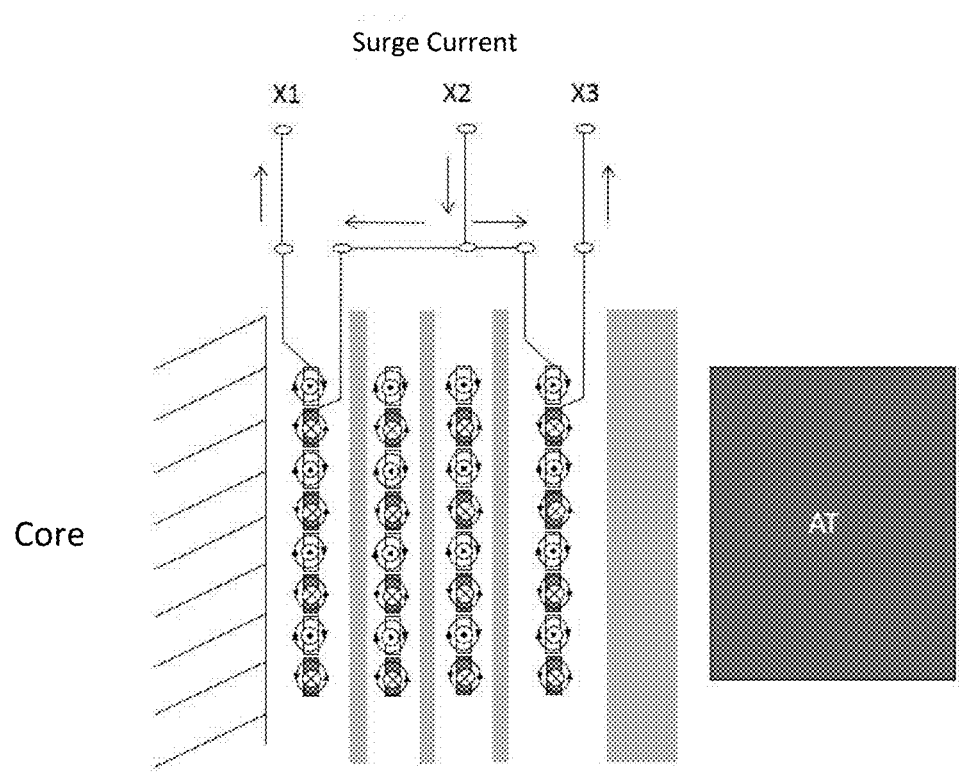
FIG. 3 shows the surge current path and magnetic fields in the secondary windings with the interleaved arrangement of the present invention.

With the arrangement of the present invention, local and immediately opposite magnetic fields are produced which are canceled even more effectively than in the currently available winding configurations (FIG. 3). By establishing the aforementioned configuration, the need to have a multiple of four in the number of layers and number of turns in the secondary windings is eliminated, the requirement of the interlaced connection in said windings is eliminated, the balancing of the dispersion reactances is preserved, the magnitude of circulating currents between the windings is decreased and, a low magnitude of the voltage induced by surge currents due to the cancellation of magnetic fluxes between adjacent conductors is guaranteed.

Figure 4:
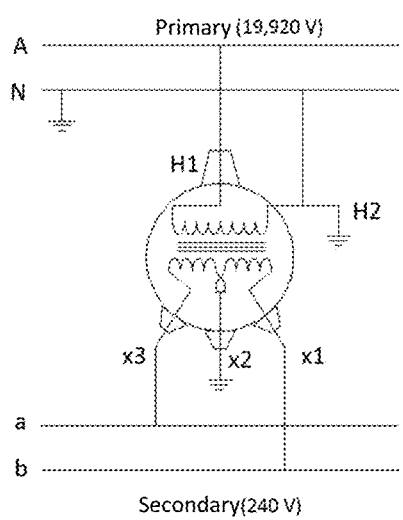
FIG. 4 shows the connection of the transformers evaluated in a monophase system.
Figure 5:
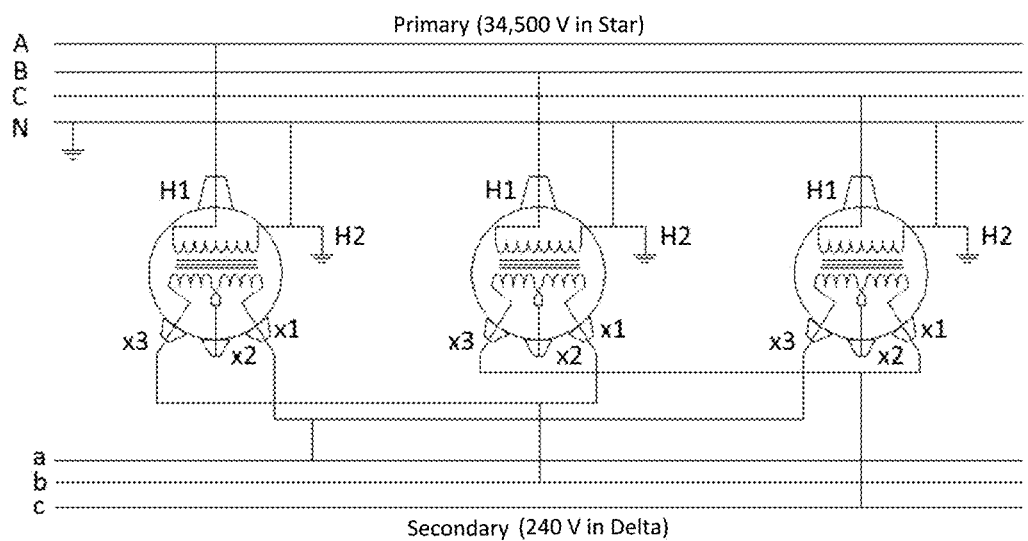
FIG. 5 shows the connection of the transformers evaluated in a delta-star three phase system.

To demonstrate the behavior of the winding arrangement of the present invention, it was compared with respect to a conventional arrangement. The transformers considered for the comparative analysis corresponded to two monophase residential type transformers, prepared to operate at full load 10 kVA capacity, with a single winding on the side of the primary one (high voltage) configured to be connected in a monophase system with 19920 V phase voltage as seen in FIG. 4. This type of transformers can also be used in a three-phase system by connecting them in a grounded star configuration allowing a 34,500 V, line voltage as seen in FIG. 5. Because the terminal H2 of the primary winding, in all cases is connected to ground, this type of transformers only consists of a single nozzle for terminal H1. The side of the secondary one consisted of two winding sections each to supply 120 V, so they can be connected in series for 240 V supply or in parallel for 120 V supply at full load. This part of the transformer consisted of three nozzles X1, X2 and X3. The live parts were prepared with tip output at a certain percentage of the total number of layers of the high voltage winding. The detail of the layer in which each tip of test comes out is mentioned in table 3.1.

TABLE 3.1

Location of the tip output in the high voltage winding.

| Transformer Terminal | C (interlaced winding) % of total AT Layer | I (interleaved winding) % of total AT Layer |
|---|---|---|
| 1 | 17% | 11% |
| 2 | 29% | 23% |
| 3 | 40% | 34% |
| 4 | 51% | 46% |
| 5 | 63% | 57% |
| 6 | 74% | 69% |
| 7 | 86% | 80% |
| % of Total Layers AT | 100% | 100% |

The prototypes described above were assembled in cylindrical tanks "post type" with a nozzle on the high voltage side.

Figure 6:
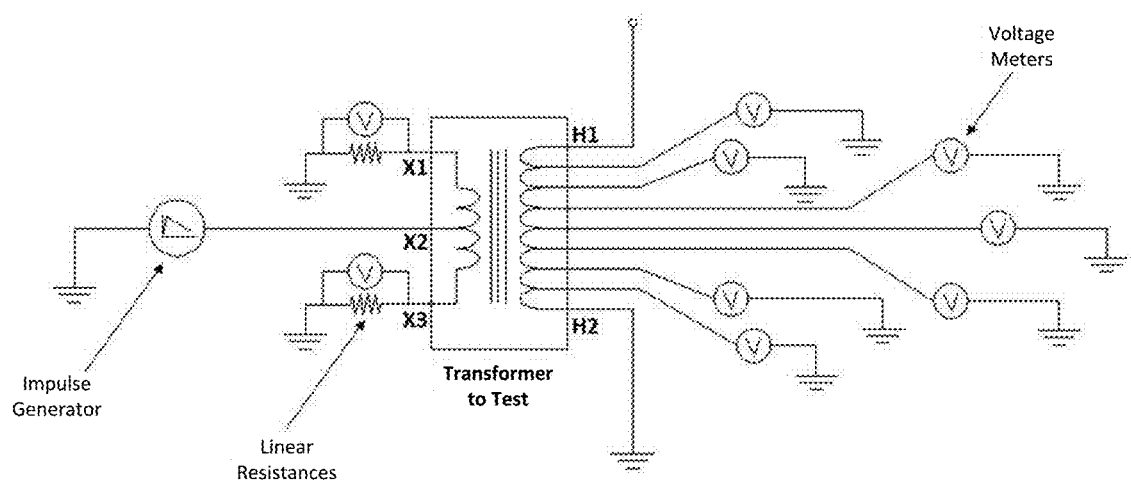
FIG. 6 shows an electrical diagram of scaled surge current test.

To validate the performance of the interleaved windings of the secondary one with respect to the voltage induced in the primary one due to the lightning surge current, a comparison was made between the two proposed prototypes. The test was named "Escalated Surge Current Test". The connection thereof is shown in FIG. 6.

This test consisted of supplying a wave of 400 V impulse voltage of 1.2×50 µs in the secondary winding through terminal X2, in such a way that it produces a current that penetrates through said terminal and then returns to ground through terminals X1 and X3. At the output of each of these terminals, a 500-ohm linear resistance and a voltage meter were connected in series, seeking to obtain the current value in the secondary one. Both prototypes were prepared with a surplus in the high voltage conductor (AT) at a certain number of layers, so that they served as "terminals" for the intermediate measurement of the requested voltage.

The test equipment used for this case was a Haefely® Model RSG 482 Recurrent Generator with a maximum load voltage of 500 V. The impulse test was carried out individually; that is, an impulse was shot and the voltage of one intermediate high-voltage tip was measured at the same time until the values of the seven tips were obtained, ensuring that the impulses did not show a variation greater than 3% between shot and shot. The voltages obtained were normalized and plotted against the tip tested to compare the behavior obtained for the two prototypes.

Figure 7:
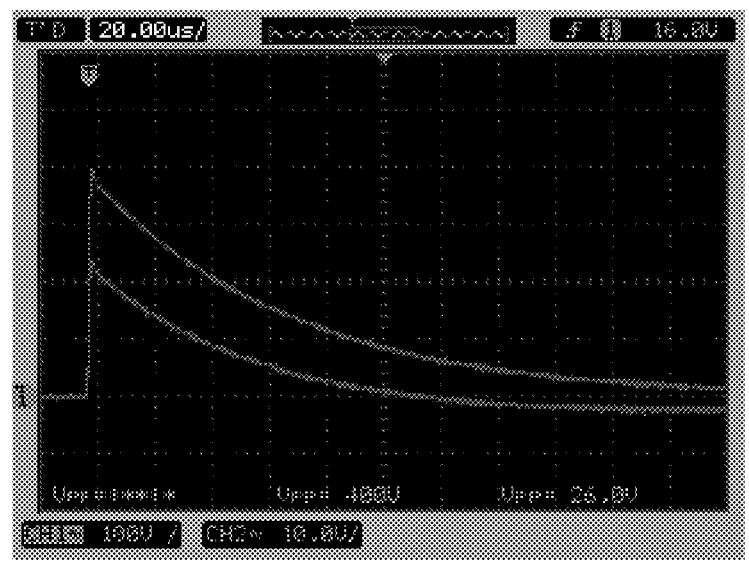
FIG. 7 shows the voltage curves supplied in the low voltage winding by terminal X2 (400 V) and the induced voltage measured in terminal number 3 (at 40% of the total turns) of the high voltage winding (26.0 V) of transformer C.

As mentioned above, the impulse test is carried out individually at different locations of the high voltage winding. FIG. 7 shows the voltage curves supplied in the low voltage winding by terminal X2 (400 V) and the voltage induced in terminal number 3 in layer 14 of the high voltage winding (26.0 V) of the prototype (C). Tables 4.1 and 4.2 show the voltages referred to ground obtained for the interlaced prototype (C) and for the interleaved prototype (I) respectively, while in FIG. 8 it is shown as a graph, the comparative in induced voltages of both prototypes.

TABLE 4.1

Test results in interlaced prototype (C).

| Terminal | AT winding percentage | Ground induced voltage in AT winding |
|---|---|---|
| 1 | 17% | 26.4 V |
| 2 | 29% | 26.4 V |
| 3 | 40% | 26.4 V |
| 4 | 51% | 26.4 V |
| 5 | 63% | 26.4 V |
| 6 | 74% | 26.4 V |
| 7 | 86% | 26.4 V |

TABLE 4.2

Test results in interleaved prototype (I).

| Terminal | AT winding percentage | Ground induced voltage in AT winding |
|---|---|---|
| 1 | 11% | 19.0 V |
| 2 | 23% | 18.4 V |
| 3 | 34% | 18.8 V |
| 4 | 46% | 19.0 V |
| 5 | 57% | 18.0 V |
| 6 | 69% | 18.8 V |
| 7 | 80% | 19.0 V |

The current observed in each of the output terminals of the secondary winding (X1 and X3) is 0.6 amperes, so there is a current of 1.2 total amps fed by terminal X2.

Figure 8:
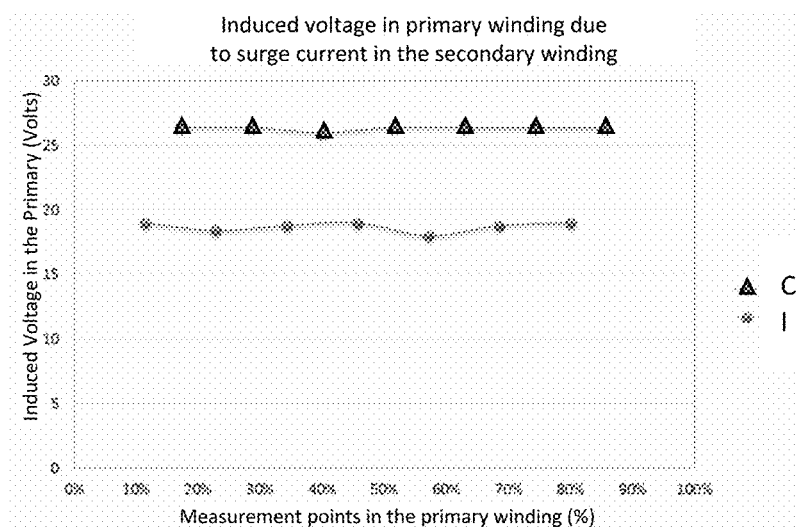
FIG. 8 shows the comparative graph of induced voltages in the scaled surge current test.

In graph of FIG. 8, it can be seen that the interleaved winding shows a better performance in the task of canceling the magnetic fields generated in the two sections of the secondary winding, allowing to induce a smaller amount of voltage in the primary winding and fulfilling the function of protecting it when the phenomenon of surge current occurs.

On the other hand, the following performance tests were also carried out on each of the prototypes.

Power losses with the transformer under load

To carry out this test, the input and output parameters of the two transformers evaluated were first obtained. Table 4.3 shows in summary the comparison of the behavior of power losses with load in both prototypes with the serial and parallel connections in their secondary windings.

TABLE 4.3

Comparison of the behavior in tests of power losses with load.

| | Prototype C (interlaced) | | | Prototype I (interleaved) | | |
|---|---|---|---|---|---|---|
| | BT connection | | | | | |
| | Series | Parallel | Difference | Series | Parallel | Difference |
| I²R losses (pu) | 1.000 | 1.002 | 0.002 | 1.011 | 1.017 | 0.006 |
| Indeterminate losses (pu) | 1.000 | 1.964 | 0.964 | 0.957 | 1.942 | 0.985 |
| Load losses (pu) (Watts) | 1.000 | 1.016 | 0.016 | 1.010 | 1.031 | 0.031 |

In the summary presented in Table 4.3, it is observed that with the interleaved configuration of the windings, the effect of the losses with load when changing from serial to parallel connection is more sensitive to electromagnetic phenomena than seen in interlaced windings; However, the result obtained does not represent a risk condition that discredits the functionality of the interleaved connection of the windings, since the variations seen with this configuration are within the range of historical variation observed for this type of transformers.

Impedance Voltage

In order to obtain the percentage of impedance in each of the connections, the percentage values of resistance and reactance of the set of windings for each connection thereof (series and parallel) were calculated. Table 4.4 summarizes the comparison of the behavior in impedance percentage tests in both prototypes with the serial and parallel connections in their secondary windings.

TABLE 4.4

Comparison of the behavior in impedance percentage tests.

| | Prototype C (interlaced) | | | Prototype I (interleaved) | | |
|---|---|---|---|---|---|---|
| | BT connection | | | | | |
| | Series | Parallel | Difference | Series | Parallel | Difference |
| Resistance (%) | 0.93 | 0.93 | 0.00 | 0.94 | 0.95 | 0.01 |
| Resistance (%) | 1.26 | 1.33 | 0.07 | 1.08 | 1.15 | 0.07 |
| Impedance (%) | 1.57 | 1.63 | 0.06 | 1.43 | 1.49 | 0.06 |

In the summary presented in Table 4.4, it is observed that with the interleaved configuration of the windings, the effect of the impedance percentage when switching from serial to parallel connection is more sensitive than that seen in interlaced windings; however, the result obtained does not represent a risk condition that discredits the functionality of the interleaved connection of the windings, since the variations seen with this configuration are within the range of regulation variation that should not be greater than 7.5% for this type of transformers.

The results shown above make it possible to ensure that the arrangement of interleaved windings of the present invention effectively cancels the voltage induced in the primary winding, without increasing the risk of failure due to the effects of the surge current; likewise, they make it clear that the arrangement object of the present, has a better performance in the task of canceling the magnetic fields generated in the two sections of the secondary winding than the conventional arrangements currently available.

The present invention has been described according to a preferred embodiment; however, it will be apparent to a technician with average knowledge in the field, that modifications may be made to the invention, without departing from its spirit and scope.

The invention claimed is:

1. An interleaved windings arrangement for power residential transformers, wherein the interleaved windings arrangement comprises two low voltage secondary windings (BT1 and BT2), the low voltage secondary windings (BT1 and BT2) comprise conductors, the conductors are interleaved adjacent to each other, and the conductors of the low voltage secondary windings (BT1 and BT2) are connected to three secondary terminals, wherein the three secondary terminals comprise a first secondary terminal (X1), a second secondary terminal (X2), and a third secondary terminal (X3), in such a way that when current flows through the second secondary terminal (X2), the current flowing through the low voltage secondary windings (BT1 and BT2) flows in opposite directions to each other, and magnetic fields generated around the conductors have opposite directions, so that a voltage induced in a high voltage winding is decreased.

2. The interleaved winding arrangement according to claim 1, wherein the conductors of the low voltage secondary windings (BT1 and BT2) are connected to the first secondary terminal (X1), the second secondary terminal (X2), and the third secondary terminal (X3) in a series or in a parallel arrangement.

* * * * *